(12) United States Patent
Chickanosky et al.

(10) Patent No.: US 8,381,052 B2
(45) Date of Patent: Feb. 19, 2013

(54) CIRCUIT AND METHOD FOR EFFICIENT MEMORY REPAIR

(75) Inventors: Valerie H. Chickanosky, South Burlington, VT (US); Kevin W. Gorman, Fairfax, VT (US); Suzanne Granato, Essex Junction, VT (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 219 days.

(21) Appl. No.: 12/615,856

(22) Filed: Nov. 10, 2009

(65) Prior Publication Data

US 2011/0113280 A1    May 12, 2011

(51) Int. Cl.
*G06F 11/00* (2006.01)
*G01R 31/28* (2006.01)
(52) U.S. Cl. .......................................... 714/733; 714/30
(58) Field of Classification Search .................. None
See application file for complete search history.

(56) References Cited

U.S. PATENT DOCUMENTS

| | | | |
|---|---|---|---|
| 2,512,027 A | 6/1950 | Lippert et al. | |
| 4,456,980 A | 6/1984 | Yamada et al. | |
| 4,747,080 A | 5/1988 | Yamada | |
| 5,128,944 A | 7/1992 | Flaherty et al. | |
| 5,383,195 A | 1/1995 | Spence et al. | |
| 5,539,702 A | 7/1996 | Ahn | |
| 5,546,537 A | 8/1996 | McClure | |
| 5,909,404 A | 6/1999 | Schwarz | |
| 5,912,901 A | 6/1999 | Adams et al. | |
| 6,202,179 B1 | 3/2001 | Morzano | |
| 6,255,836 B1 | 7/2001 | Schwarz et al. | |
| 6,496,947 B1 * | 12/2002 | Schwarz | 714/30 |
| 6,634,003 B1 | 10/2003 | Phan | |
| 6,643,807 B1 * | 11/2003 | Heaslip et al. | 714/719 |
| 6,829,728 B2 | 12/2004 | Cheng et al. | |
| 6,934,205 B1 | 8/2005 | Pandey et al. | |
| 7,117,408 B2 | 10/2006 | Dixit et al. | |
| 7,194,670 B2 | 3/2007 | Fales et al. | |
| 7,206,979 B1 * | 4/2007 | Zarrineh et al. | 714/718 |
| 7,206,984 B2 * | 4/2007 | Anzou | 714/733 |
| 7,237,165 B2 | 6/2007 | Chadwick et al. | |
| 7,251,757 B2 | 7/2007 | Ouellette et al. | |
| 7,284,175 B2 | 10/2007 | Wang et al. | |
| 7,313,739 B2 | 12/2007 | Menon et al. | |
| 7,444,564 B2 | 10/2008 | Anand et al. | |
| 7,458,000 B2 | 11/2008 | Gorman et al. | |
| 7,506,200 B2 | 3/2009 | Benhase et al. | |
| 7,607,060 B2 * | 10/2009 | Gorman et al. | 714/733 |
| 2002/0071326 A1 | 6/2002 | Suzuki | |

(Continued)

OTHER PUBLICATIONS

Nicola Campregher "FPGA Interconnect Fault Tolerance", 2005 IEEE, pp. 725-726.

(Continued)

*Primary Examiner* — Guerrier Merant
(74) *Attorney, Agent, or Firm* — David Cain; Roberts Mlotkowski Safran & Cole, P.C.

(57) ABSTRACT

A circuit and method of testing a memory and calculating a repair solution for a given address location includes pausing a built in self test (BIST) operation on detection of a failing memory output data of an integrated circuit. During the pause, the circuit and method analyzes "n" number of groups of the failing memory output data during "n" cycles using analysis logic and calculating a repair solution. Normal operations can be resumed.

21 Claims, 6 Drawing Sheets

U.S. PATENT DOCUMENTS

| | | | |
|---|---|---|---|
| 2004/0163015 A1 | 8/2004 | Nadeau-Dostie et al. | |
| 2005/0120270 A1* | 6/2005 | Anand et al. | 714/30 |
| 2005/0120284 A1* | 6/2005 | Ouellette et al. | 714/718 |
| 2005/0160310 A1 | 7/2005 | Ellis et al. | |
| 2006/0221731 A1* | 10/2006 | Kobatake | 365/200 |
| 2007/0291560 A1* | 12/2007 | Hsieh et al. | 365/200 |
| 2008/0092003 A1* | 4/2008 | Khoche et al. | 714/733 |
| 2008/0222464 A1* | 9/2008 | Gorman et al. | 714/718 |

OTHER PUBLICATIONS

Ioannis Voyiatzi et al., "A Concurrent Built-In Self-Test Architecture Based on a Self-Testing RAM," IEEE Transactions on Reliability, vol. 54, No. 1, Mar. 2005, pp. 69-78.

D.C. Huang et al., "A Parallel Transparent BIST Method for Embedded Memory Arrays by Tolerating Redundant Operations." IEEE Transactions on Computer-Aided Design of Integrated Circuits and Systems, col. 21, No. 5, May 2002, pp. 617-628.

Li-Ming Deng et al., "An Enhanced SRAM BISR Design with Reduced Timing Penalty," IEEE 2006, 15$^{th}$ Asian Test Symposium.

Andrzej Krasniewski, "Application-Dependent Testing of FPGA Delay Faults." IEEE Xplore, Dec. 7, 2009 (Downloaded) (8 Pages).

Carol Pyron et al., "DFT Advance in Motorola's MPC7400, a PowerPC Microprocessor," 1999 IEEE, pp. 137-146.

Said Hamdioui et al., "Efficient Tests and DFT for RAM Address Decoder Delay Faults." IEEE Xplore Dec. 7, 2009 (Downloaded) (6 pages).

\* cited by examiner

CIRCUIT AND METHOD FOR EFFICIENT MEMORY REPAIR

FIELD OF THE INVENTION

The invention relates to a circuit and method for efficient memory repair, and more particularly, to a built-in-self-test (BIST) and method for calculating efficient memory repair.

BACKGROUND

Memory is a compact circuit that can be embedded on a chip (integrated circuit (IC)). Memory macros often include redundancy to allow for the repair of failing elements. However, memory redundancy takes area and can impact performance, so it necessarily must be limited. For example, efficient use of memory redundancy is necessary in order to maximize memory yield (e.g., it is desired to repair as many failing elements as possible with as few redundant memory elements as possible).

When embedded on a chip with other logic, the ability to test the memory becomes difficult and time consuming. For this reason, it is not uncommon to have a built-in self-test (BIST) mechanism within the chip (i.e., an integrated circuit (IC)) to verify all or a portion of the internal functionality of the IC. The BIST includes Built In Self Repair (BISR) circuitry, which includes a FARR (failing address and repair register). In implementation, the FARR makes the required calculations to fix memory FAILS, e.g., location of a failure, e.g. failed memory element in an array. The FARR, though, takes up valuable space in the memory array.

More specifically, BISR circuitry is often used to determine how to make use of memory redundancy. BISR circuitry is preferred because it allows for on chip self repair (which reduces manufacturing test time and cost because of reduced Automatic Test Equipment (ATE) requirements and interactions) and enables in-system repair operations (where ATE may not be available). Since BISR circuitry is embedded on the chip any mechanism of reducing BISR circuit area while still allowing for efficient/optimum use of memory redundancy is beneficial. Many BISR circuits receive FAIL information and must generate a repair decision within one clock cycle (allowing the BISR circuitry to handle a new FAIL on the next cycle, back to back FAILS being a possible occurrence).

In an effort to test "at speed" and "at frequency", the BIST (i.e., FARR) has to operate at the same frequency of the memory array. However, for the FARR to achieve such frequency, optimization results in duplication of logic (parallelism). This results in valuable area requirements for the FARR. In operation, though, the memory array is working at a frequency that may be higher than the remaining logic used for testing the memory array (e.g., BIST, BISR, FARR).

Accordingly, there exists a need in the art to overcome the deficiencies and limitations described hereinabove.

SUMMARY

In an aspect of the invention, a method of testing a memory and calculating a repair solution for a given address location comprises pausing a built in self test (BIST) operation on detection of a failing memory output data of an integrated circuit. During the pause, the method comprises analyzing "n" number of groups of the failing memory output data during "n" cycles using analysis logic that is time shared across the "n" groups, and calculating a repair solution. The BIST then resumes normal operations.

In an aspect of the invention, a method comprises: detecting a FAIL; determining that there are no multiple FAILS detected within any segment for a particular row of a memory array in an integrated circuit; determining that a failing row address matches any stored row address for a particular region; determining that the matching row address has been enabled for a repair; issuing a pause command; and providing a solution to a failed memory element at the failing row address.

In an aspect of the invention, a structure for analyzing failing memory output data for a failing address location comprises failure analysis logic that can determine a repair solution for the failing address location. The failing memory output data is organized into "n" groups such that a selected group is multiplexed into the failure analysis logic using a n-to-1 multiplexor. The repair solution makes use of a spare row or a spare column in a memory array.

In another aspect of the invention, a design structure embodied in a machine readable medium for designing, manufacturing, or testing an integrated circuit is provided. The design structure comprises the structures and/or methods of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a circuit and method for efficient memory repair, and more particularly, to a built-in-self-test (BIST), and method for calculating efficient memory repair. In embodiments, the system and method includes testing memory output data and calculating a repair solution for one or more FAILS at a given address location during a pause operation. In embodiments, the failing memory output data can be organized into 'n' groups such that a selected group is multiplexed into analysis logic using a n-to-1 multiplexer.

The system and method employs a BIST finite or programmable state machine, where the operation of the BIST can be paused upon detection of failed memory output data and, and while the pause is active, calculate a best repair solution so that the paused BIST can resume normal operation. Advantageously, by pausing the BIST operations it is possible to decrease the size of the related FARR (failing address and repair register) while optimizing testing. The best repair solution can make use of a spare row or a spare column.

In embodiments, the system and method of the present invention can rely on a micro-burst architecture such as, for example, that disclosed in U.S. Pat. No. 7,194,670, the contents of which are incorporated by reference herein in its entirety. In the micro-burst architecture, the BIST operation will pause between bursts. In this way, using the micro-burst architecture, the BIST engine can spend several cycles setting up/generating data values prior to the next burst of read/write commands to the memory. Thus, the BISR circuitry can spend time between burst operations processing the data.

Figure 1:
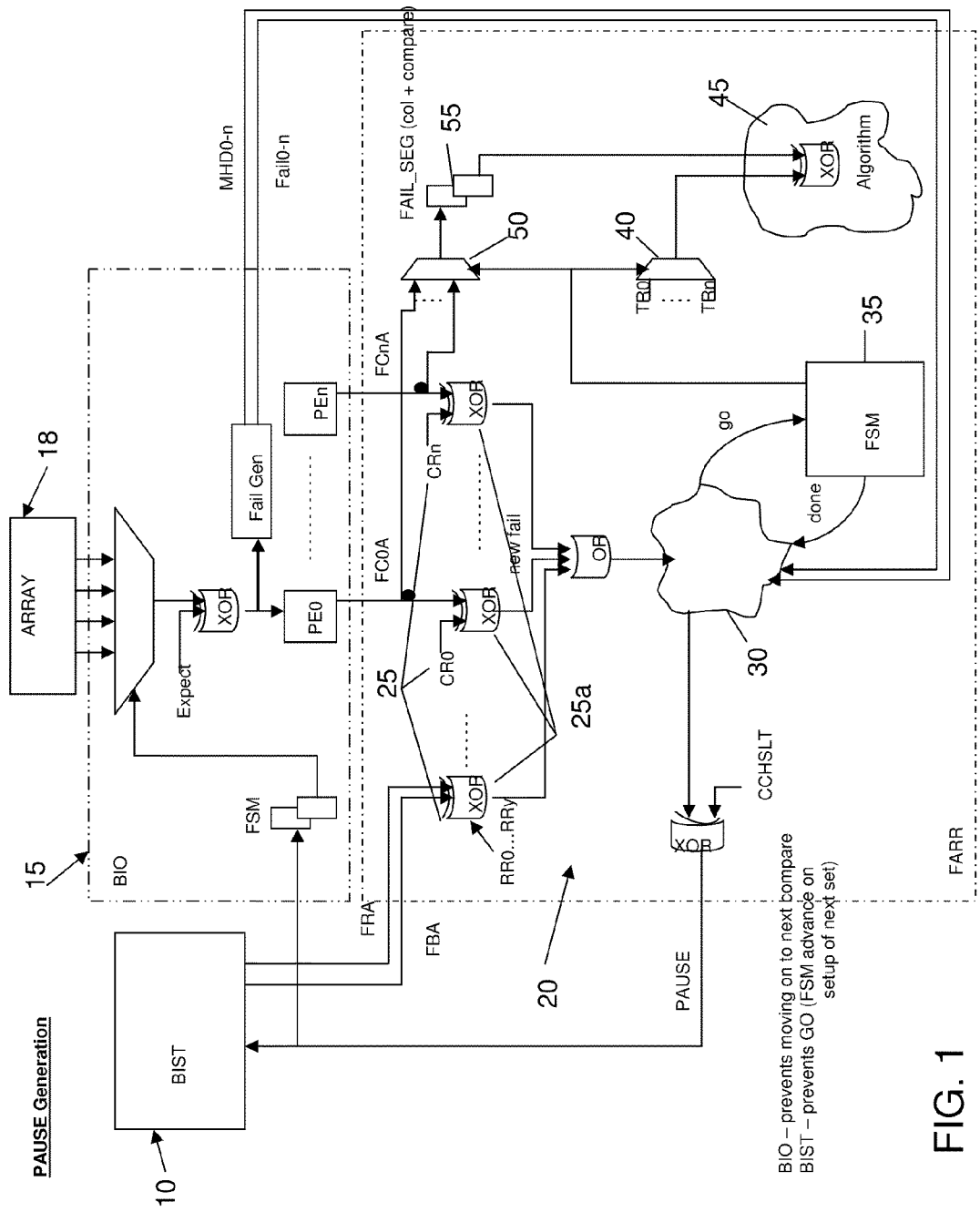
FIG. 1 shows a built-in-self-test (BIST) architecture in accordance with aspects of the invention.

FIG. 1 shows a BISR (Built In Self Repair) architecture in accordance with aspects of the invention. In specific embodiments, the present invention modifies the BISR circuit such that two dimensional redundancy analysis (allocating redundant rows and columns) can be performed in a single test pass (which reduces tester time) while providing significant area improvements over traditional circuits (e.g., area reductions of 5-10× are common).

More specifically, FIG. 1 shows a conventional BIST 10 with conventional BIO (BIST Input Output) logic 15. The conventional BIO logic 15 receives output data from a memory array 18 and performs comparisons between what is read from the memory array to what is expected to have been read from the memory array. For example, if the expected data does not match the data from the array then the BIO logic 15 generates failing addresses, FCO0-FCnA (representing the location of the failing bit(s) in each segment, e.g., the width of an array may be divided into segments, e.g., 8 segments. The BIST provides the current row and bank address under test (FRA/FBA). The BIO logic 15 also generates a flag per segment (Fail0-$n$) indicating a FAIL was discovered, which serves as the enable for a FARR logic 20.

By making such a comparison, it is possible to determine the location of a failure, e.g., failed memory element in an array. Although the BIST is configured to test random access memory (RAM), those skilled in the art will appreciate that the BIST can be configured for testing memory of substantially any type (e.g., read only memory, register file memory, single port memory, dual port memory, content-addressable memory, etc.). Moreover, the BIST can be configured for testing a single memory or a plurality of memories.

The BIST architecture also includes FARR (failing address and repair register) logic 20. In embodiments, the FARR logic 20 is designed and structured to pause the BIST operation, under certain circumstances, e.g., when a FAIL is detected. For example, in embodiments, the BIST operation will be paused when:
 a new failed memory element is found (e.g., a FAIL that was not previously recorded);
 the failed memory element has not already been marked to be repaired;
 the failed memory element is not un-repairable; and/or
 there is an available redundant element that has not already been planned to be used for another failed memory element.

Accordingly, in operation, rather than trying to process each FAIL in a single cycle so that back to back FAILS can be handled, the FARR logic 20 prevents any more data from being processed and prevents the BIST 10 from enabling the next burst operation. This allows the BISR to process the FAIL over many cycles. By processing a FAIL over many cycles, the comparison/decision structures can be used multiple times as a decision is arrived at (rather than having to have parallel/replicated structures as would be needed in conventional systems), allowing for large area savings (e.g., BISR circuitry is usually dominated by combinational logic area rather than latch area).

Still referring to FIG. 1, in operation, the FARR logic 20 includes a plurality of registers 25, e.g., RR0, . . . RRy, CR0, . . . CRn each having an associated comparator (XOR) 25$a$. (It should be understood that an XOR can provide the function, but that the present invention also contemplates the function provided by a combination of basic logic gates, such as AND's and OR's, or NOR's, or NANDs, etc. Accordingly, the XOR serves as the abbreviation for the function.) For example, CR0 may be a column repair register or redundant column address register. For each repair register, a determination is made as to whether a FAIL has been marked for repair. If a new FAIL is found, logic 30 will direct the BIST operation to pause in order to repair the failed memory element for a particular segment.

During the pause operation, for each segment 1, 2, . . . n, a finite state machine (FSM) 35 will take one cycle at a time and act as a pointer to each failing memory output data at a given address location. In operation, the first time a failing address is encountered, it will be stored in a temporary register corresponding to the segment. The FSM will point to the temporary register and the FAIL information for each segment, and funnel them to the failure analysis logic 45. The failure analysis logic 45 will determine the best repair solution, e.g., calculate a repair solution for a memory failure at a given address location. In this way, while the pause is active, "n" number of groups of the failing memory output data can be analyzed during "n" cycles using failure analysis logic 45. Once a decision is made and, if applicable, the failed memory output is repaired, the FSM 35 will inform the logic 30 of the outcome, which in turn, will end the BIST pause. The repair solution may include making use of a spare row or a spare column in the memory segment.

By way of an illustrative example, the width of an array may be divided into segments, e.g., 8 segments. In this example, each segment has a redundant column used for making column repairs. Redundant rows, used for making row repairs, span the segments. In operation, the BIST 10 and BIO 15 logic step through the rows of the array and perform comparisons on the read data values to expected data values. These comparisons are performed on a segment basis and reported to the FARR 20 for each segment, e.g., 8, for the row analyzed. The FARR 20 uses the failure analysis logic 45 to decide whether to repair with a row, a column, or a combination. This failure analysis logic 45 may include storage for storing coordinates for fails, row and column, such as registers comprising flip-flops. This may be used as a scratch pad (see, e.g., US Pub. No. 2005/0160310A1 which is incorporated in its entirety herein by reference), to obtain an efficient description of the terrain of the FAILS for an efficient use of available redundant array elements for repair. An example scratch pad uses 8 temporary registers, 1 per segment that records the coordinates of the FAIL, row address and column address of the FAIL, for that segment. Repair registers comprise 1 column repair register per segment, and 1 row repair register per redundant row element. The repair calculation can be stored in repair registers (e.g., register 25) that indicate how the redundant elements in the array are to be used to repair the FAIL.

Whenever a FAIL is reported to the FARR 20, the FARR 20 issues a pause to the BIST 10. The decision to pause is based on, for example, whether the FAIL is new, amongst other factors as discussed above. In embodiments, a pause is not issued, for example, when the FAIL has been seen already in the scratch pad, if the FAIL has been marked for repair in the repair registers, or if the memory is marked as not repairable. While paused, the FARR 20 uses the FSM 35 to point to which segment 50, and which temporary register 40, is to be used to analyze the FAIL in the failure analysis logic 45. At the end of the FSM operation, the pause is dropped to continue BIST operation. Advantageously, the logic for the FAIL can be used repeatedly, on successive cycles (8), to analyze the segments.

At the completion of the BIST analysis of the array, FAIL collection mode or FARR mode, there may be entries left in the scratch pad. In this scenario, the FARR 20 is signaled that FARR mode is complete, and the FARR issues the pause. While paused, the FARR 20 uses the FSM 35 to point 40 to the entries in the scratch pad, e.g., each of 8 temporary registers, to dispose of the FAILS recorded using part of the same failure analysis logic 45 used during the main analysis. At the completion of the FSM operation, the pause is dropped to continue BIST operation. In this way, the BIST can process fail(s) through repair regions sequentially, 1 cycle per region, to reuse the one comparison/decision logic block.

Figure 2:
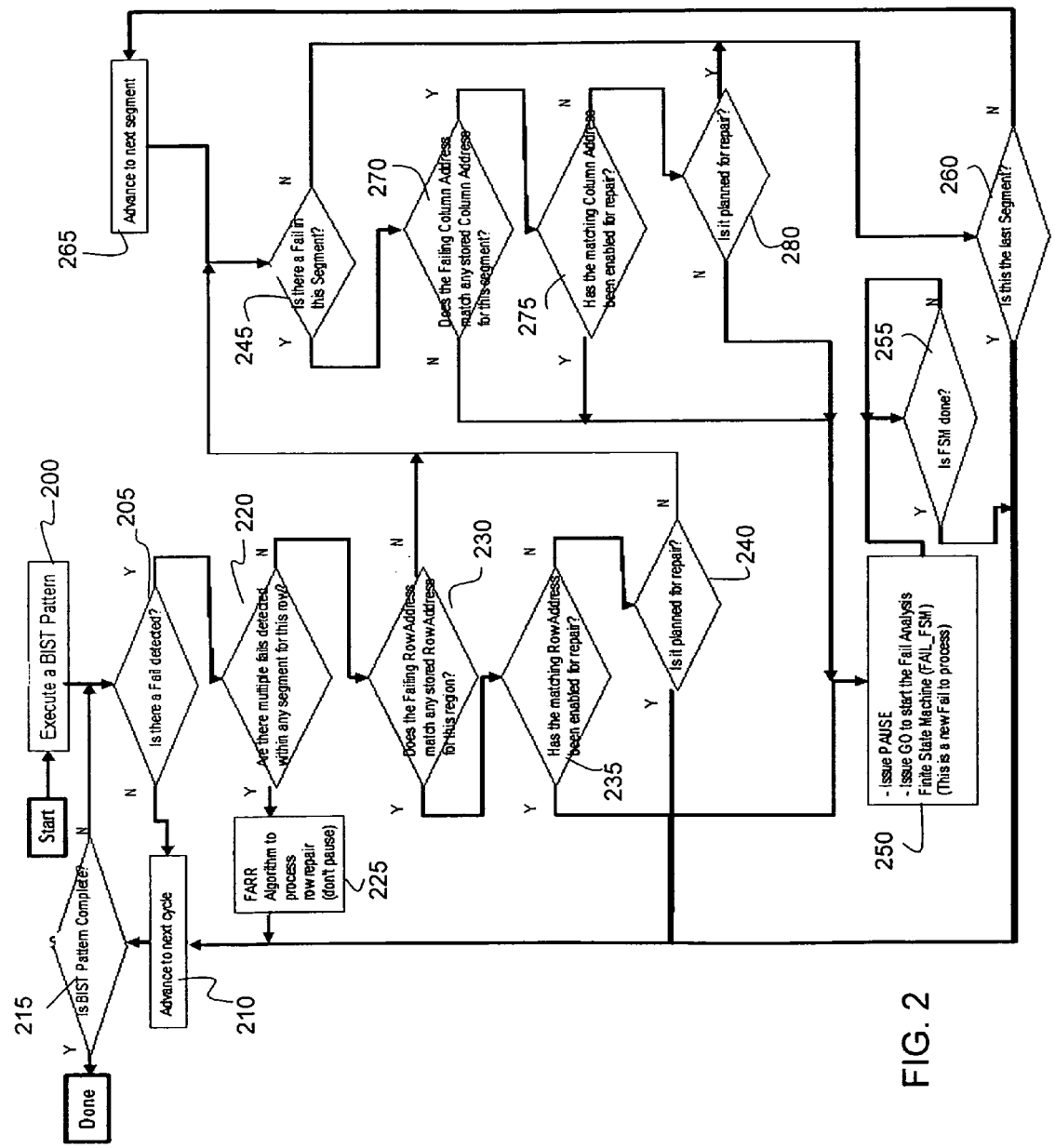
FIG. 2 shows a flow diagram of an exemplary process implementing the system of the present invention.

FIG. 2 shows a flow diagram of an exemplary process implementing the system of the present invention. The flow diagram may equally represent a high-level block diagram or a swim-lane diagram of the invention. The flow diagram and/or block diagram illustrates the architecture, functionality, and operation of possible implementations of systems, methods and computer program products according to various embodiments of the present invention. In this regard, each block in the flow diagram, block diagram or swim-lane diagram may represent a module, segment, or portion of code, which comprises one or more executable instructions for implementing the specified logical function(s). It should also be noted that, in some alternative implementations, the functions noted in the blocks may occur out of the order noted in the figure. For example, two blocks shown in succession may, in fact, be executed substantially concurrently, or the blocks may sometimes be executed in the reverse order, depending upon the functionality involved. Each block of each flow diagram, and combinations of the flow diagram illustration can be implemented by special purpose hardware-based systems that perform the specified functions or acts, or combinations of special purpose hardware and computer instructions and/or software, as described above. Moreover, the steps of the flow diagram may be implemented and executed from either a server, in a client server relationship, or they may run on a user workstation with operative information conveyed to the user workstation. In an embodiment, the software elements include firmware, resident software, microcode, etc.

Furthermore, the invention can take the form of a computer program product accessible from a computer-usable or computer-readable storage medium providing program code for use by or in connection with a computer or any instruction execution system. The software and/or computer program product can be implemented in any computing environment, having the appropriate hardware (CPU, memory, etc). For the purposes of this description, a computer-usable or computer readable storage medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

Referring back to FIG. 2, at step 200, the program control executes a BIST pattern. At step 205, a determination is made as to whether a FAIL has been detected. If no FAIL has been detected, at step 210, the control advances to the next cycle. At 215, a determination is made as to whether the BIST pattern is completed. If so, the process ends. If the BIST pattern is not completed, the process continues to step 205.

At step 205, if a FAIL is detected, the program control will continue to step 220. At step 220, a determination will be made as to whether there are multiple FAILS detected within any segment for a particular row. If there are multiple FAILS, the process continues to step 225. At step 225, the FARR will process a row repair (without a pause), and continue to step 210. In this implementation, as all segments will be repaired, there is no need to pause.

If, at step 220, multiple FAILS are not found, the process continues to step 230. At step 230, a determination is made as to whether the failing row address matches any stored row address for a particular region (e.g., a failure is found in the redundant element). If yes, at step 235, a determination is made as to whether the matching row address has been enabled for a repair. If not enabled for a repair, at step 240, a determination is made as to whether there is a plan for a repair. If there is a plan for a repair, the process continues to step 210. If there is no planned repair at step 240, or if there is no match between a failing row address and any stored row address for a particular region at step 230, the process continues to step 245.

Referring back to step 235, if a determination is made that the matching row address has been enabled for a repair, the process will continue to step 250. At step 250, the program control will issue a PAUSE command. In addition, at step 250 (or a separate step), the program control will issue a GO to start the fail analysis via the FSM, for example. At step 255, a determination will be made as to whether the FSM has completed its operations (for each region/segment, etc.). If not, the processes will continue at step 255. If the operations are complete, the process will continue to step 210.

Continuing at step 245, a determination is made as to whether there is a FAIL in a particular segment of the array. If not, the process continues to step 260. At step 260, a determination is made as to whether the segment is the last segment in the array. If the segment is the last segment in the array, the process continues to step 210. If not the last segment, the process will advance to a next segment, at step 265. The process will then continue at step 245.

If, at step 245, a FAIL is found in the segment, the process will continue to step 270. At step 270, a determination is made as to whether the failing column address matches any stored column address for the segment. If not, the process will revert to step 250. If there is a match at step 270, a determination will be made as to whether the matching column address has been enabled for a repair at step 275. If there is a match, the process continues to step 250. If no repair has been enable, the process continues to step 280. At step 280, a determination is made as to whether there is a planned repair for the FAIL. If not, the process continues to step 250. If there is a planned repair, the process continues to step 260.

Figure 3:
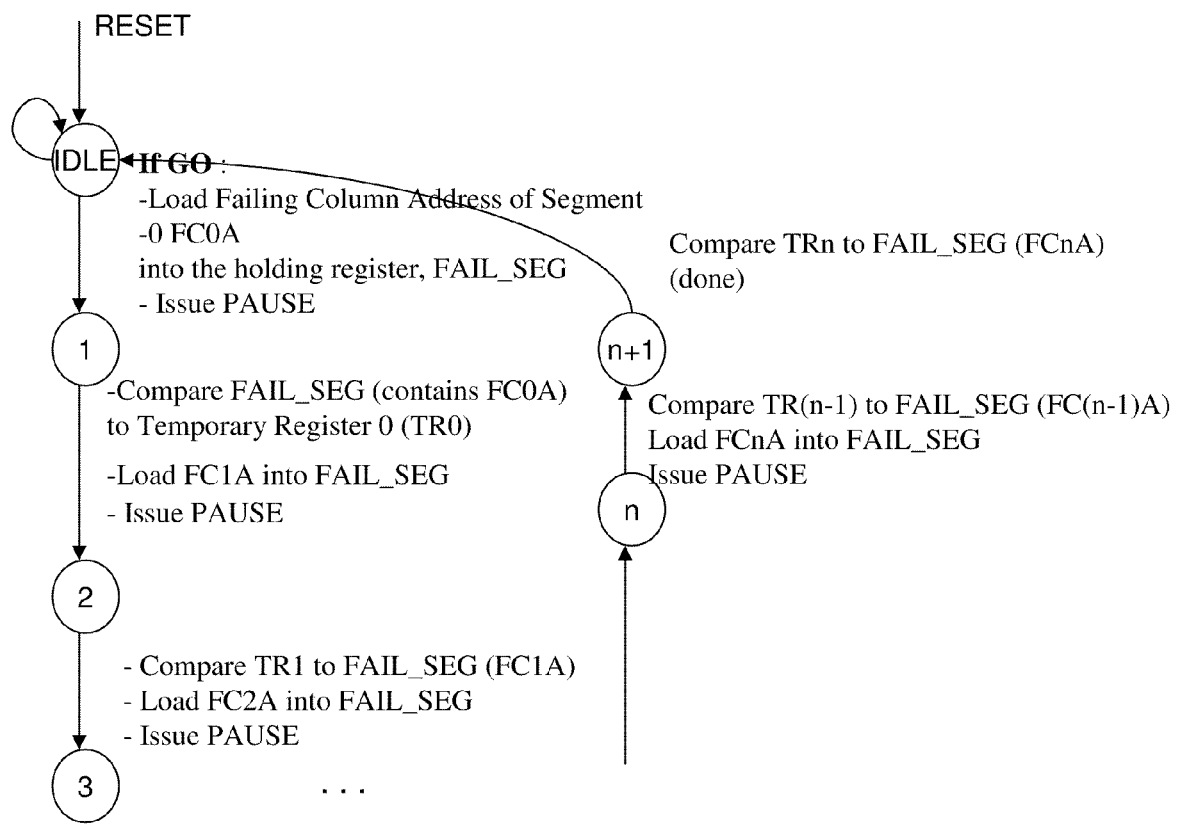
FIG. 3 shows a method of using the FSM (finite state machine) in a FAIL operation in accordance with the present invention.

FIG. 3 shows a method of using the FSM in a FAIL analysis operation in accordance with the present invention. In FIG. 3, the FSM is shown to be used as a pointer to each segment to be analyzed by the failure analysis logic of FIG. 1 (using shared comparison/decision logic that is reused for each repair region in a serial fashion, thereby saving area). In this example, a FAIL_SEG (holding register) 55 is loaded any time a new failure is identified for a particular segment. For example if a FAIL is asserted and the FAIL is deemed to be a "new" address not previously marked for repair then the address FC0A is loaded into FAIL_SEG. The BIST operation is paused (the next burst is prevented from starting) and comparisons are made against the temporarily stored failing address in TR0 (state 1). If there are multiple FAILS within a single repair region (segment) then a row repair signal would be asserted and a row repair made. The address is stored in whatever redundant row element is available (RR0-$y$). (If no redundant row element is available, then the memory is marked as unfixable.)

Likewise if the FAIL within a segment has a matching row address (FRA/FBA) as that stored in the temporary failing address register TR0, then the FRA/FBA address is stored in whatever redundant row element is available (RR0-$y$). If no redundant row element is available, then the memory is marked as unfixable. If the row address is different, but the column address (FC0A) has been seen before and temporarily stored in TR0 (but not repaired), then it is stored as a repair in CR0. If this address is completely new and no previous FAIL has been stored in a temporary register, then it is stored in temporary register TR0. If the failing column address is new and temporary register TR0 already contains a new address, a row repair is attempted using RR0-RRy (if any redundant rows are available). If none are available then too many FAILS have been found within the repair region (segment) and the memory is marked as unfixable. These are examples of fail analysis logic of FIG. 1; although the present invention contemplates other fail analysis logic. The FAIL_SEG register and temporary register are input to the fail analysis logic 45.

The fail analysis logic is then repeated using shared comparison/decision logic for any segment seen as failing (the FARR steps through states 2 through n). After all repair regions have been examined, the PAUSE signal is deasserted (stopped) and the BIST resumes testing. In this way, the repair regions are processed sequentially using shared comparison/decision logic over multiple state machine steps (multiple clock cycles) to achieve much reduced area.

More specifically, initially the FSM remains idle. At step IDLE, if a FAIL is found, and the pause conditions are met, the FSM will issue a pause instruction to the BIST, and the FSM will load the failing column address of the segment 0 (e.g., column "0" address (FC0A)) into a holding register (FAIL_SEG). At step 1, the failure analysis logic will compare the FAIL_SEG (containing failing address (FC0A)) to a temporary register 0 (TR0). In step 1, the FSM will load the next failing column address of the segment 1 (e.g., column "1" address (FC1A)) into a holding register (FAIL_SEG). Also, the FSM will issue a pause instruction to the BIST. At step 3, the failure analysis logic will compare the FAIL_SEG (FC1A) to a temporary register (TR1). In step 3, the FSM will load the next failing column address of the segment 2 (FCA2) into a holding register (FAIL_SEG). Also, if a FAIL is found, and the pause conditions are met, the FSM will issue a pause instruction to the BIST. Similarly, at step n, the failure analysis logic will compare the FAIL_SEG (FC(n−1)A) to a temporary register (TR(n−1)). In step n, the FSM will issue a pause instruction to the BIST. At step n+1, the FSM will compare the temporary register TRn to the FAIL_SEG (FCnA), and will not issue a pause instruction to the BIST, thereby deasserting the PAUSE signal. Once completed, the process will return to IDLE.

Figure 4:
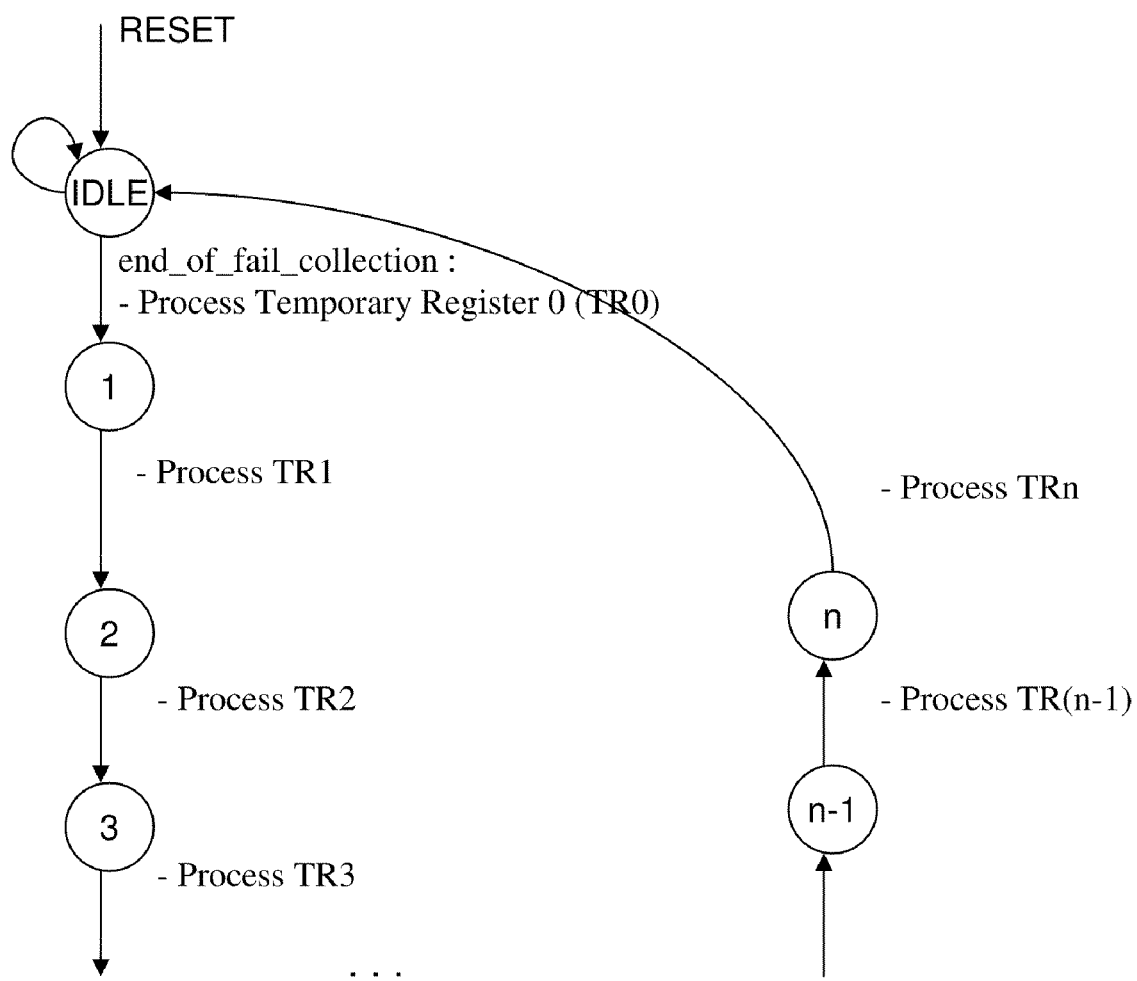
FIG. 4 shows a method of using the FSM at an end of a FAIL collection in accordance with the present invention.

FIG. 4 shows a method of using the FSM at an end of a FAIL collection in accordance with the present invention. In this example, when BIST testing in complete, and FAILS are recorded, the BIST indicates that fail collection is complete, and the FARR can clear out the scratch pad (temporary registers TR0-$n$). The FSM is used as a pointer to each register of the scratch pad to be analyzed by the same fail analysis logic as was used previously (the comparison/decision logic is again reused over multiple cycles). This process clears out and disposes of the remaining entries in the scratch pad.

More specifically, as discussed above, after completion of the FAIL collection (processes), FAILS may still be stored in temporary registers. For this reason, when BIST operations are complete, the FARR may request the FSM to continue processing by having the logic analyze the FAILS, one at a time (sequentially). For example, after FAIL collection is complete, the logic can continue to analyze/process the information (FAILS) in the Temporary Register 0 (TR0). In step 1, the logic can continue to analyze/process the information (FAILS) in the Temporary Register 1 (TR1). In step 2, the logic can continue to analyze/process the information (FAILS) in the Temporary Register 2 (TR2). In step 3, the logic can continue to analyze/process the information (FAILS) in the Temporary Register 3 (TR3). In step n−1, the logic can continue to analyze/process the information (FAILS) in the Temporary Register TR(n−1). In step n, the logic can continue to analyze/process the information (FAILS) in the Temporary Register TRn.

Figure 5:
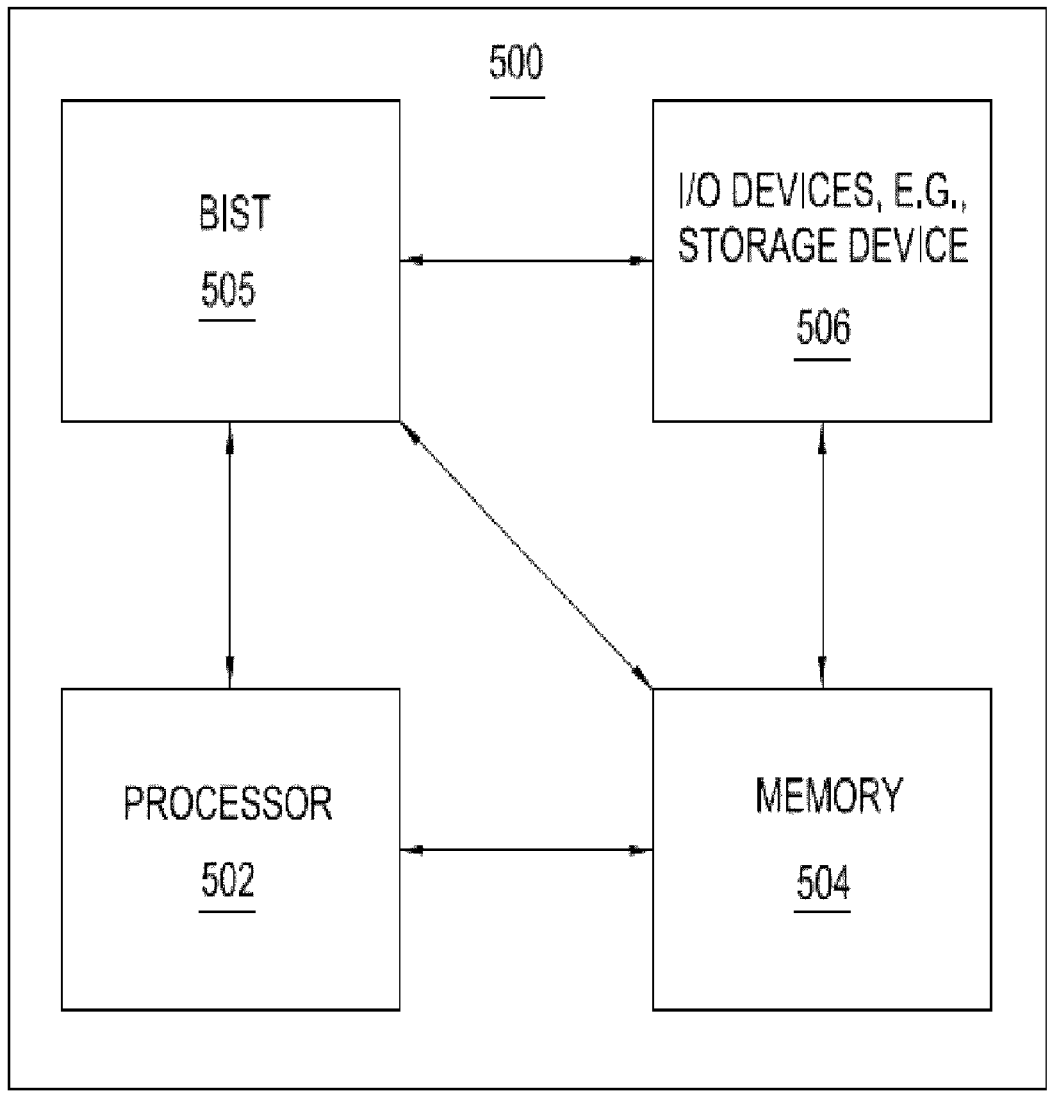
FIG. 5 is a high level block diagram of the present BIST method that is implemented using a general purpose computing device.

FIG. 5 is a high level block diagram of the present built-in self-test method that is implemented using a general purpose computing device 500. In one embodiment, a general purpose computing device 500 comprises a processor 502, a memory 504, a BIST module 505 and various input/output (I/O) devices 506 such as a display, a keyboard, a mouse, a modem, a microphone, a speaker, a network connection and the like. In one embodiment, at least one I/O device is a storage device (e.g., a disk drive, flash memory, an optical disk drive, a floppy disk drive). It should be understood that the BIST module 505 can be implemented as a physical device or subsystem that is coupled to a processor through a communication channel.

Alternatively, the BIST module 505 can be represented by one or more software applications (or even a combination of software and hardware, e.g., using Application-Specific Integrated Circuits (ASIC)), where the software is loaded from a storage medium (e.g., I/O devices 506) and operated by the processor 502 in the memory 504 of the general purpose computing device 500. Additionally, the software may run in a distributed or partitioned fashion on two or more computing devices similar to the general purpose computing device 500. Thus, in one embodiment, the BIST module 505 for testing embedded memory described herein with reference to the preceding figures can be stored on a computer readable storage medium (e.g., RAM, magnetic or optical drive or diskette, and the like).

In conclusion, the present invention takes advantage of how a particular BIST architecture works to achieve significant area reductions. The BIST engine performs a setup of 4 cycles of memory operation (the number 4 is chosen for purposes of illustration, and anyone skilled in the art would recognize that this number could be anything equal to or greater than 2). Once this setup is complete, the 4 operations are applied as a "micro-burst" to the memory using the memory's at-speed functional clock. This micro-burst may consist of any number of cycles, not necessarily limited to four. Once the micro-burst is complete, the BIST engine will setup the next 4 cycles of operation, again using a slow clock. This architecture has the primary advantage of limiting the amount of BIST logic that needs to run "at-speed" (only the memory and "fast BIO logic" runs at-speed), greatly reducing the design time needed to close functional timing for a chip design.

Figure 6:
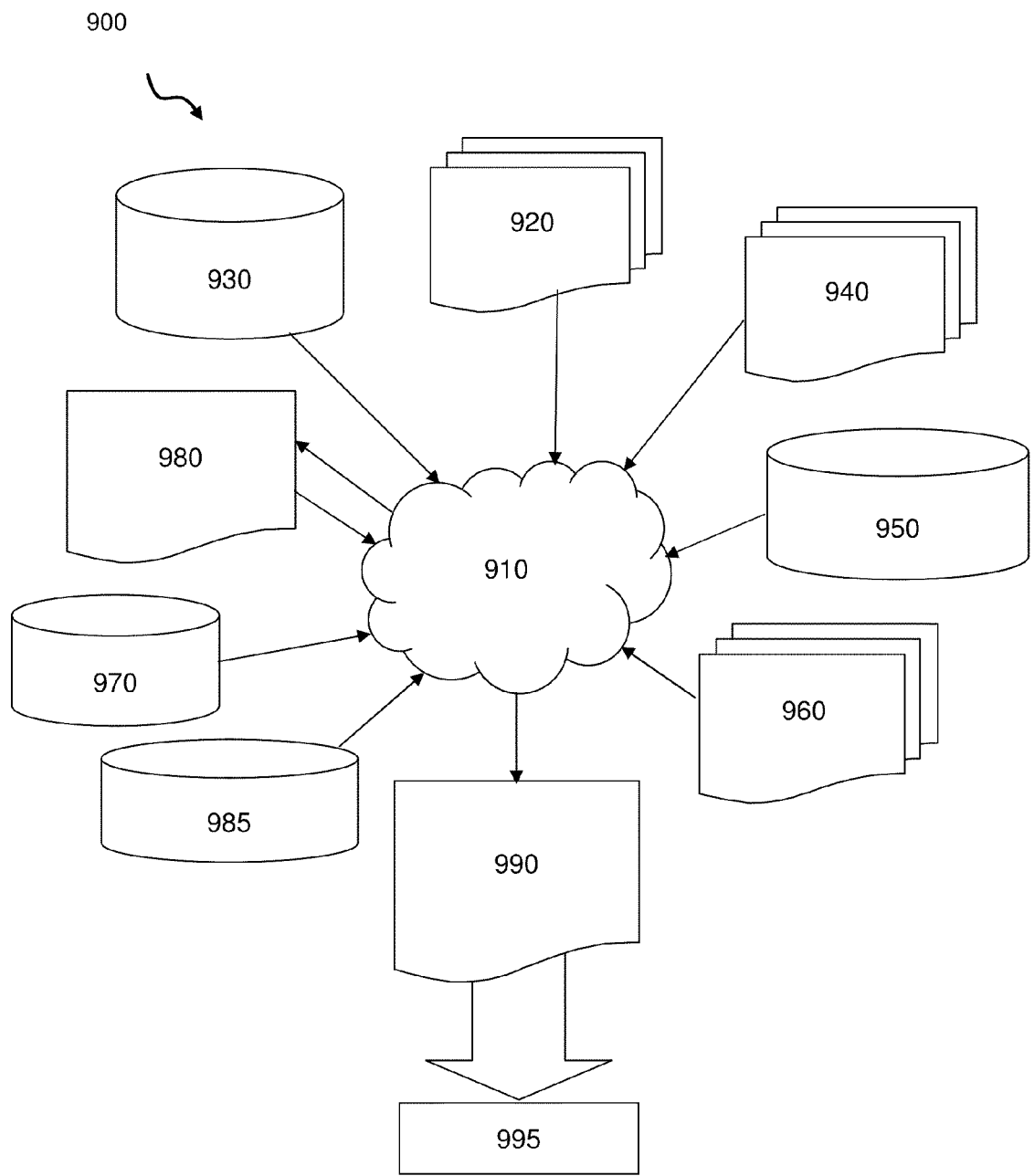
FIG. 6 shows a flow diagram of a design process used in semiconductor design, manufacture, and/or test.

FIG. 6 illustrates multiple design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of testing a memory and calculating a repair solution for a given address location, comprising:
    pausing a built in self test (BIST) operation on detection of a failing memory output data of an integrated circuit, the failing memory output data comprising "n" number of groups;
    during the pause, analyzing the "n" number of groups of the failing memory output data during "n" cycles using analysis logic that is time shared across "n" groups and calculating a repair solution for the failing memory output data; and
    resuming normal operations.

2. The method of claim 1, wherein the pausing is performed when at least one of:
    a failed memory element is newly found;
    the failed memory element has not already been marked to be repaired;
    the failed memory element is not un-repairable; and
    there is an available redundant element that has not already been planned to be used for another failed memory element.

3. The method of claim 1, further comprising receiving output data from a memory array and performing comparisons between what is read from the memory array to what is expected to have been read from the memory array.

4. The method of claim 3, further comprising generating a failing address representing a location of failing bit(s) in each segment of the memory array when the expected data does not match data read from the memory array.

5. The method of claim 4, further comprising generating a flag per segment indicating a FAIL was discovered, which serves as an enable for a FARR (failing address and repair register) logic.

6. The method of claim 1, further comprising preventing any more data from being processed and preventing the BIST from enabling a next operation during the analysis.

7. The method of claim 6, wherein the preventing allows a Built In Self Repair (BISR) to process a FAIL over many cycles such that comparison/decision structures can be used multiple times upon arrival of a decision.

8. The method of claim 1, wherein during the pause, a finite state machine (FSM) will take one cycle at a time and act as a pointer to each failing memory output data at a given address location.

9. The method of claim 8, wherein failure addresses are held temporarily in a temporary register and funneled to a failure analysis logic.

10. The method of claim 9, wherein the failure analysis logic determines the repair solution by calculating the repair solution for a memory failure at the given address location.

11. The method of claim 8, wherein the failure analysis logic decides whether to repair with a row, a column, or a combination.

12. The method of claim 1, wherein the pause is not issued when a FAIL has been seen already in a scratch pad, the FAIL has been marked for repair in repair registers, or the memory is marked as not repairable.

13. The method of claim 1, wherein at a completion of a FAIL collection mode, entries left in a scratch pad are analyzed during another pause operation.

14. The method of claim 1, wherein the BIST operation pauses a first time a failing address is detected.

15. A method of testing a memory and calculating a repair solution for a given address location, comprising:
    pausing a built in self test (BIST) operation on detection of a failing memory output data of an integrated circuit, the failing memory output data comprising "n" number of groups;
    during the pause, analyzing the "n" number of groups of the failing memory output data during "n" cycles using analysis logic that is time shared across "n" groups and calculating a repair solution; and
    resuming normal operations, wherein:
        the BIST operation pauses a first time a failing address is detected;
        the BIST operation pauses between read/write commands to the memory; and
        generating data values over one or more cycles prior to a next burst of read/write commands, by a BIST engine.

16. The method of claim 15, further comprising processing data between bursts, by a Built in Self Repair (BISR) circuit.

17. The method of claim 16, further comprising performing two-dimensional redundancy analysis in a single test pass, by the BISR circuit.

18. The method of claim 17, further comprising preventing the BIST operation from enabling the next burst, by a failing address and repair register (FARR) logic.

19. The method of claim 1, wherein the BIST operation:
    processes one of the "n" number of groups of the failing memory output data per cycle sequentially; and
    re-uses a fail analysis logic for each group of the "n" number of groups.

20. The method of claim 19, wherein a finite state machine (FSM) acts as a pointer to registers of one or more scratch pads for a next group which is analyzed by the fail analysis logic used for a previous group.

21. The method of claim 20, wherein:
    a failing address register repair (FARR) requests the FSM to process FAILS in "n" number of registers, one at a time; and
    the BIST operation resumes after all of the "n" number of groups are processed.

* * * * *